(12) United States Patent
Kim et al.

(10) Patent No.: US 8,648,374 B2
(45) Date of Patent: Feb. 11, 2014

(54) LIGHT EMITTING DIODE DEVICE INCLUDING A HEAT-RADIATION/LIGHT-REFLECTION MEMBER

(75) Inventors: Ha chul Kim, Seoul (KR); Sea-Kyoung Huh, Seoul (KR); Hwa-Gune Chong, Incheon (KR)

(73) Assignee: Lumirich Co., Ltd., Incheon (KR)

( * ) Notice: Subject to any disclaimer, the term of this patent is extended or adjusted under 35 U.S.C. 154(b) by 32 days.

(21) Appl. No.: 13/334,117

(22) Filed: Dec. 22, 2011

(65) Prior Publication Data

US 2012/0286310 A1 Nov. 15, 2012

(30) Foreign Application Priority Data

May 9, 2011 (KR) .................... 10-2011-0043271
Aug. 1, 2011 (KR) .................... 10-2011-0076503

(51) Int. Cl.
*H01L 33/00* (2010.01)

(52) U.S. Cl.
USPC .......................................... 257/98

(58) Field of Classification Search
USPC .......................................... 257/98
See application file for complete search history.

(56) References Cited

U.S. PATENT DOCUMENTS

| 6,881,980 | B1 | 4/2005 | Ting |
| 2003/0201451 | A1 | 10/2003 | Suehiro et al. |
| 2006/0163601 | A1 | 7/2006 | Harle et al. |
| 2006/0268556 | A1* | 11/2006 | Hsieh ............... 362/347 |
| 2010/0012957 | A1* | 1/2010 | Lin et al. ............ 257/98 |
| 2010/0149819 | A1* | 6/2010 | Oon et al. ........ 362/296.07 |
| 2010/0163905 | A1* | 7/2010 | Kim .................. 257/98 |
| 2010/0193816 | A1* | 8/2010 | Liu .................. 257/98 |
| 2011/0049553 | A1 | 3/2011 | Park |

FOREIGN PATENT DOCUMENTS

| EP | 1786043 A1 | 5/2007 |
| JP | 10-215002 | 8/1998 |
| JP | 2003152228 A * | 5/2003 |
| KR | 10-0705241 | 4/2007 |
| KR | 10-0788931 | 12/2007 |
| KR | 10-0867568 | 11/2008 |
| KR | 10-0965120 | 6/2010 |
| WO | WO 2010140693 A1 | 12/2010 |

* cited by examiner

*Primary Examiner* — Anthony Ho
(74) *Attorney, Agent, or Firm* — Rabin & Berdo, P.C.

(57) ABSTRACT

A light emitting diode device includes: a cathode lead frame; an anode lead frame which is electrically insulated from the cathode lead frame; a light emitting diode chip which is electrically connected to the cathode lead frame and the anode lead frame respectively; a synthetic resin member which forms an indentation receiving the light emitting diode chip and fixes the cathode lead frame and the anode lead frame; and a metallic heat-radiation/light-reflection member which covers at least a portion of the indentation and covers an upper surface of the synthetic resin member.

13 Claims, 5 Drawing Sheets

LIGHT EMITTING DIODE DEVICE INCLUDING A HEAT-RADIATION/LIGHT-REFLECTION MEMBER

CROSS-REFERENCE TO RELATED APPLICATION

This application claims priority to and the benefit of Korean Patent Application No. 10-2011-0043271 filed in the Korean Intellectual Property Office on May 9, 2011 and Korean Patent Application No. 10-2011-0076503 filed in the Korean Intellectual Property Office on Aug. 1, 2011, the entire contents of which are incorporated herein by reference.

FIELD OF THE INVENTION

The present invention relates to a light emitting diode device.

BACKGROUND ART

In a conventional light emitting diode device, a reflection plate made of synthetic resin is attached to a lead frame, so yellowing or thermal deformation of reflection plate may occur and this may deteriorate credibility and makes it difficult to be applied to a high output light emitting diode device.

Meanwhile, a technology in which a light emitting diode device is made using a ceramic substrate in order to be applied to a high output light emitting diode device has been introduced, but the ceramic substrate increases manufacturing cost and deteriorates light efficiency.

TECHNICAL PROBLEM

The present invention has been made in an effort to provide a light emitting diode device which can achieve good heat radiation characteristics and light efficiency even when it is applied to a high output light emitting diode device.

TECHNICAL SOLUTION

A light emitting diode device according to an exemplary embodiment of the present invention includes: a cathode lead frame; an anode lead frame which is electrically insulated from the cathode lead frame; a light emitting diode chip which is electrically connected to the cathode lead frame and the anode lead frame respectively; a synthetic resin member which forms an indentation receiving the light emitting diode chip and fixes the cathode lead frame and the anode lead frame; and a metallic heat-radiation/light-reflection member which covers at least a portion of the indentation and covers an upper surface of the synthetic resin member.

The metallic heat-radiation/light-reflection member may include a light-reflection portion which covers at least a portion of an inner surface of the indentation so as to form a reflection space where light emitted from the light emitting diode chip is reflected, and a heat radiation portion which is extended from the light reflection portion to cover the upper surface of the synthetic resin member.

The heat radiation portion may be extended from the upper surface of the synthetic resin member and along the side of the synthetic resin member to a bottom of the synthetic resin member.

The heat radiation portion may be formed to contact one of the cathode lead frame and the anode lead frame.

The light emitting diode chip may be mounted to one of the cathode lead frame and the anode lead frame, and the heat radiation portion may contact one of the cathode lead frame and the anode lead frame to which the light emitting diode chip is mounted.

The cathode lead frame and the anode lead frame may include respectively a cathode lead and an anode lead which are respectively extended to the bottom of the synthetic resin member, and the heat radiation portion may contact one of the cathode lead and the anode lead.

The light emitting diode chip may be mounted to one of the cathode lead frame and the anode lead frame, and the heat radiation portion may contact one of the cathode lead and the anode lead so as to contact one of the cathode lead frame and the anode lead frame on which the light emitting diode chip is mounted.

The heat radiation portion may be configured to contact one of the cathode lead frame and the anode lead frame.

The light emitting diode chip may be mounted to one of the cathode lead frame and the anode lead frame, and the heat radiation portion may be configured to contact one of the cathode lead frame and the anode lead frame to which the light emitting diode chip is mounted.

The light reflection portion may be formed to cover an upper portion of an inner surface of the indentation, and a lower portion of the inner surface of the indentation may be formed as a reflection surface to reflect light emitted from the light emitting diode chip.

The light reflection portion may be separated from upper surfaces of the cathode lead frame and the anode lead frame by the synthetic resin member.

The reflection space may be filled with epoxy resin or silicon resin containing phosphor.

A surface of the light reflection portion may be coated with metal for improving a light reflectivity.

The reflection space may be emptied so as to form an air layer, and the light emitting diode device may further include a lens which is provided on an upper surface of the metallic heat-radiation/light-reflection member to cover the reflection space and is provided with a phosphor layer.

A surface of the metallic heat-radiation/light-reflection member may be coated with phosphor.

The lens may have a convex shape in an upward direction.

The lens may have a planar shape.

The metallic heat-radiation/light-reflection member may be formed by the cathode lead frame and the anode lead frame, and the cathode lead frame and the anode lead frame may form together the metallic heat-radiation/light-reflection member by forming a seat on which the light emitting diode chip is mounted and a slanted reflection surface which is extended upwardly and outwardly from the seat so as to reflect light emitted from the light emitting diode chip.

The synthetic resin member may be formed to enclose a lower surface of the seat so that the lower surface of the seat is not exposed.

The synthetic resin member may be formed to expose at least a portion of a lower surface of the seat.

The slanted reflection surface may include a plurality of slanted reflection surfaces which have different slanted angles.

The slanted reflection surface may be extended to an upper surface of the synthetic resin member, and the cathode lead frame and the anode lead frame may respectively form upset portions to cover the upper surface of the synthetic resin member.

Upper surfaces of the cathode lead frame and the anode lead frame may be respectively formed to be planar.

A sectional shape of the slanted reflection surface may be a circular or a polygonal shape.

ADVANTAGEOUS EFFECTS

According to the present invention, since the metallic heat-radiation/light-reflection member having a light reflection portion and a heat radiation portion at once is provided, when compared to a conventional reflection cup which is made of synthetic resin, heat radiation can be improved and light efficiency can also be improved. At this time, metal for improving light reflectivity is coated on the light reflection portion, so light reflectivity can be improved.

Further, since the metallic heat-radiation/light-reflection member contacts one of the lead frames on which the light emitting diode chip is mounted, heat radiation efficiency can be further enhanced.

Since the light emitting diode chip is disposed within an air layer, thermal stress acting on the light emitting diode can be reduced.

Furthermore, since the cathode lead frame and the anode lead frame forms the slanted reflection surface reflecting light emitted from the light emitting diode, the light emitting diode device can stably operate under high temperature for a long time and light efficiency and heat radiation efficiency can be improved through simple structures.

DETAILED DESCRIPTIONS OF THE EMBODIMENTS

Figure 1:
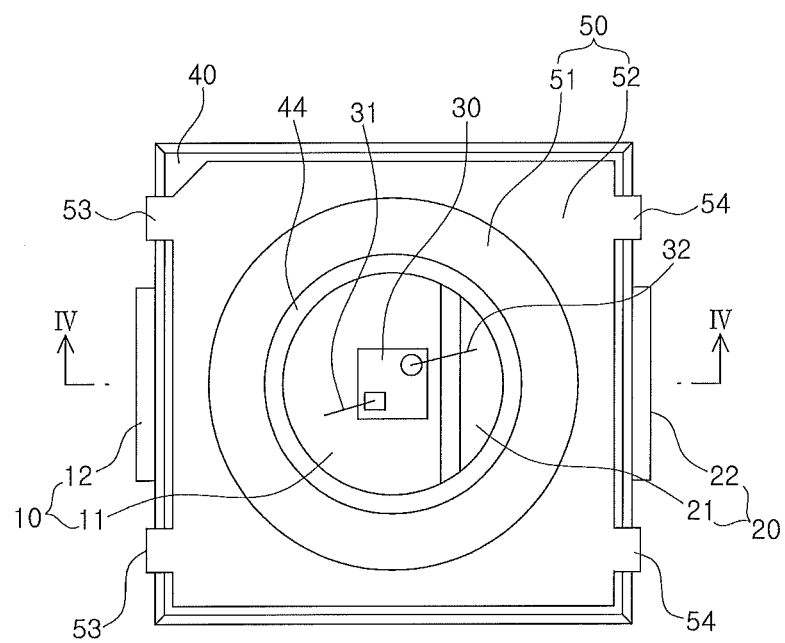
FIG. 1 is a top view of a light emitting diode device according to an embodiment of the present invention.

Embodiments of the present invention will be explained hereinafter with reference to the accompanying drawings.

In the drawings, the thickness of layers, films, panels, regions, etc. are exaggerated for clarity. Like reference numerals designate like elements throughout the specification. It will be understood that when an element such as a layer, film, region or substrate is referred to as being "on" another element, it can be directly on the other element or intervening elements may also be present. In contrast, when an element is referred to as being "directly on" another element, there are no intervening elements present.

Figure 2:
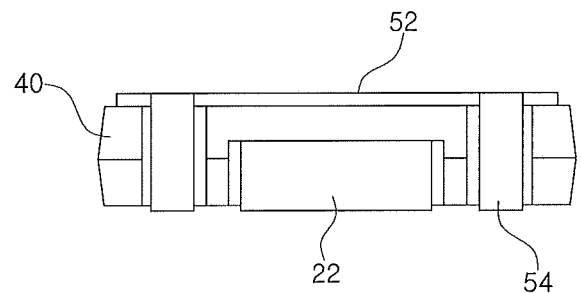
FIG. 2 is a side view of a light emitting diode device according to an embodiment of the present invention.
Figure 3:
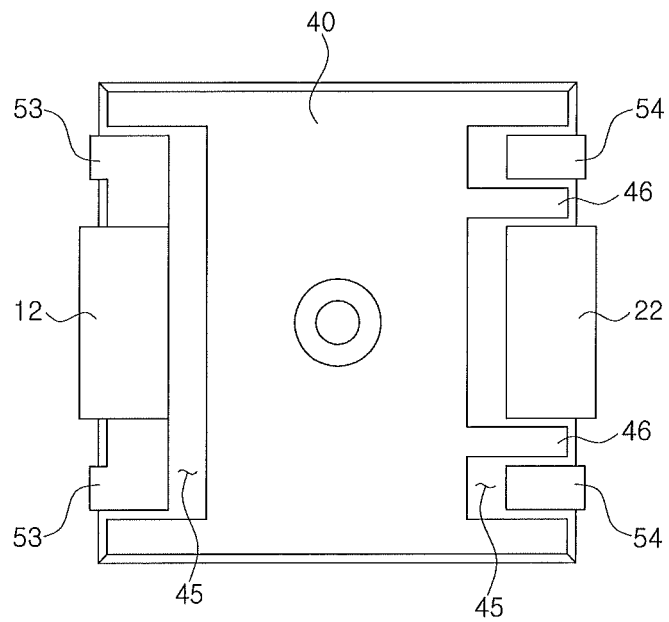
FIG. 3 is a bottom view of a light emitting diode device according to an embodiment of the present invention.
Figure 4:
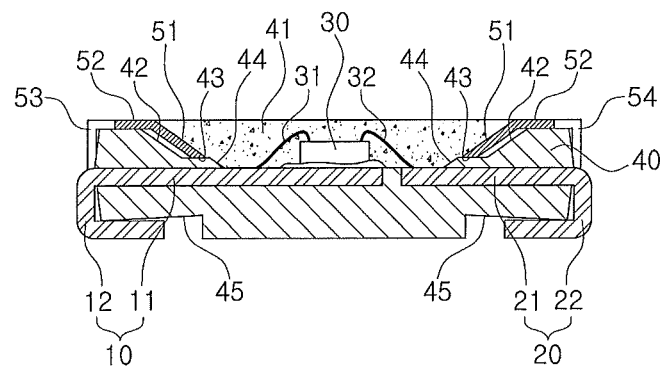
FIG. 4 is a cross sectional view taken along a line IV-IV of FIG. 1.

FIG. 1 is a top view of a light emitting diode device according to an embodiment of the present invention, FIG. 2 is a side view of a light emitting diode device according to an embodiment of the present invention, FIG. 3 is a bottom view of a light emitting diode device according to an embodiment of the present invention, and FIG. 4 is a cross sectional view taken along a line IV-IV of FIG. 1.

Referring to FIG. 1 to FIG. 4, a light emitting diode device according to an embodiment of the present invention includes a cathode lead frame 10 and an anode lead frame 20.

The cathode lead frame 10 and the anode lead frame 20 act as terminals for applying electricity to a light emitting diode (LED) chip 30, and are disposed to be electrically insulated from each other.

For example, the cathode lead frame 10 may include a cathode pad 11 and a cathode lead 12, and the anode lead frame 20 may include an anode pad 21 and an anode lead 22.

The cathode pad 11 and the anode pad 21 may be formed to be extended in a horizontal direction respectively, and the LED chip 30 may be mounted on the cathode pad 11 or the anode pad 21. In an embodiment shown in the drawings, the LED chip 30 is mounted on the cathode pad 11.

The LED chip 30 is respectively electrically connected to the cathode lead frame 10 and the anode lead frame 20. For example, the LED chip 30 may be electrically connected to the cathode pad 11 and the anode pad 21 respectively via a pair of connecting wires 31 and 32 respectively.

A synthetic resin member 40 forms an indentation 41 for receiving the LED chip 30, and may be formed to enclose the cathode lead frame 10 and the anode lead frame 20 at least partially. The synthetic resin member 40 may be formed of nonconductive synthetic resin through an injection molding, and for example, may be made of synthetic resins such as Polyphthalamide (PPA) and liquid crystal polymer (LCP).

For example, referring to FIG. 4, the indentation 41 may be formed to be downwardly indented, and may have a cup shape having a circular horizontal section view. As shown in FIG. 1 and FIG. 4, the LED chip 30 is disposed within the indention 41 of the synthetic resin member 40.

At this time, as shown in FIG. 1 and FIG. 4, inner portions of the cathode pad 11 and the anode pad 21 may be exposed to the indentation 41, and the LED chip 30 may be fixed onto the exposed inner portion of the cathode pad 11 or the anode pad 21. Further, outer portions of the cathode pad 11 and the anode pad 21 are disposed within the synthetic resin member 40.

The cathode lead 12 and the anode lead 22 are respectively extended from the cathode pad 11 and the anode pad 21 to extrude from the synthetic resin member 40. At this time, as shown in FIG. 1 to FIG. 4, the cathode lead 12 and the anode lead 22 may be formed by being downwardly extended along sides of the synthetic resin member 40 to reach the bottom thereof. At this time, as shown in FIG. 3 and FIG. 4, the cathode lead 12 and the anode lead 22 may be formed by being extended from outer ends of the bottom of the synthetic resin member 40 toward inward direction by a predetermined length. In addition, indentations 45 are formed at the bottom of the synthetic resin member 40, and the cathode lead 12 and the anode lead 22 are disposed within the indentations 45, so the bottom of the synthetic resin member 40 and the bottoms of the cathode lead 12 and the anode lead 22 may substantially form a planar surface.

A metallic heat-radiation/light-reflection member 50 is provided. The metallic heat-radiation/light-reflection member 50 plays a role of reflecting light emitted from the LED chip 30 to the outside, and a role of radiating heat generated in the LED chip 30 to the outside. The metallic heat-radiation/light-reflection member 50 may be formed of metal having good heat conductivity such as iron alloy, or aluminum alloy.

The metallic heat-radiation/light-reflection member 50 includes a light reflection portion 51 for playing a role of reflection and a heat radiation portion 52 for playing a role of heat radiation.

The light reflection portion 51 is formed to cover at least a portion of a surface of the indentation 41 of the synthetic resin member 40 so as to form a reflection space in which light emitted from the LED chip 30 is reflected. The surface of the light reflection portion 51 may be coated with metal which can improve light reflectivity, e.g., metal such as nickel Ni or silver Ag.

For example, as shown in FIG. 1 and FIG. 4, the light reflection portion 51 may have a shape of covering an upper portion of the surface of the indentation 41 of the synthetic resin member 40 except a lower portion thereof, and the light reflection portion 51 may be gradually widened as it goes upward. Since the light reflection portion 51 have such a shape, light emitted from the LED chip 30 is reflected by the light reflection portion 51 and then progresses forward and side directions.

At this time, a lower portion of the indentation 41 of the synthetic resin member 40 may be formed as a reflection surface 44 to reflect light emitted from the LED chip 30. The reflection surface 44 may be gradually widened as it goes upward with a similar angle with the light reflection portion 51 of the metallic heat-radiation/light-reflection member 50, and as shown in FIG. 4, by this structure, the light reflection portion 51 of the metallic heat-radiation/light-reflection member 50 can be separated from upper surfaces of the cathode lead frame 10 and the anode lead frame 20 by the synthetic resin member 40.

At this time, in order to stably mount the metallic heat-radiation/light-reflection member 50 within the indentation 44, referring to FIG. 4, a mounting step 43 which is extended in a horizontal direction at an upper end of the reflection surface 44 of the synthetic resin member 40, and a lower end of the light reflection portion 51 is mounted onto the mounting step 43 so that the metallic heat-radiation/light-reflection member 50 can be stably secured. Further, the synthetic resin member 40 may have a slanted portion 42 which is formed to be slanted from an outer end of the mounting step 43, and the slanted portion 42 may be the same slanted angle with the metallic heat-radiation/light-reflection member 50.

Referring to FIG. 4, a reflection space defined by the light reflection portion 51 of the metallic heat-radiation/light-reflection member 50 may be filled with epoxy resin or silicon resin which contains phosphor. Accordingly, the LED chip 30 can be protected and light characteristics can be improved.

The phosphor can be suitably selected in accordance with a desired light type. For example, in case of a light emitting diode device emitting white light, the phosphor may be $Y_3Al_5O_{12}$:Ce phosphor, $(Y,Gd)_3Al_5O_{12}$:Ce phosphor, $(Sr, Ba, Ca)_2Si_{1-}M\_O_4$:Eu phosphor (here, M may be substituted with one of Y, Ce, La, Nd, Gd, Tb, Yb, and Lu, and may additionally include at least one element), $(Sr, Ba, Ca)_2Si_{1-}O_4$:Eu phosphor, or $(Sr, Ba, Ca)_2Si_{1-}A\_O_4$:Eu phosphor (here, A may be substituted with one of F, Cl, Br, and S, and may additionally include at least one element).

The heat radiation portion 52 of the metallic heat-radiation/light-reflection member 50 is extended from the light reflection portion 51 to cover an upper surface of the synthetic resin member 40. That is, referring to FIG. 1 and FIG. 4, the heat radiation portion 52 is extended from an upper end of the light reflection portion 51 in a horizontal direction to cover an upper surface of the synthetic resin member 40 so that an upper surface thereof is exposed to the outside. Heat which is radiated from the LED chip 30 and is absorbed to the light reflection portion 51 is transmitted to the heat radiation portion 52 which is exposed to the outside and can be effectively radiated.

The heat radiation portion 52 of the metallic heat-radiation/light-reflection member 50 may be extended from an upper surface of the synthetic resin member 40 to pass the side thereof and then reach the bottom thereof. That is, referring to FIG. 1 to FIG. 4, the heat radiation portion 52 of the metallic heat-radiation/light-reflection member 50 may include an extension portion 53 which is downwardly extended to the bottom at the side of the synthetic resin member 40 where the cathode lead 12 is formed and is then inwardly extended, and an extension portion 54 which is downwardly extended to the bottom at the side of the synthetic resin member 40 where the anode lead 22 is formed and is then inwardly extended. The heat radiation portion 52 is extended to the bottom of the synthetic resin member 40, so heat can be effectively radiated.

Meanwhile, the heat radiation portion 52 of the metallic heat-radiation/light-reflection member 50 may be configured to contact one of the cathode lead frame 10 and the anode lead frame 20. At this time, in case that the LED chip 30 is mounted to one of the cathode lead frame 10 and the anode lead frame 20, the heat radiation portion 52 of the metallic heat-radiation/light-reflection member 50 may contact one of the cathode lead frame 10 and the anode lead frame 20 on which the LED chip 30 is mounted. Since the heat radiation portion 52 contacts one of the cathode lead frame 10 and the anode lead frame 20, it can effectively receive heat from the contacted lead frame so as to improve heat radiation efficiency. In particular, in case that the heat radiation portion 52 of the metallic heat-radiation/light-reflection member 50 contacts the lead frame on which the LED chip 30 is mounted, heat generated by the LED chip 30 can be effectively radiated.

In more detail, in case that the cathode lead 12 and the anode lead 22 are extended to the bottom of the synthetic resin member 40, extension portions 53 and 54 of the heat radiation portion 52 of the metallic heat-radiation/light-reflection member 50 may be extended to the bottom of the synthetic resin member 40 to contact one of the cathode lead 12 and the anode lead 22. At this time, one of the extension portions 53 and 54 of the heat radiation portion 52 of the metallic heat-radiation/light-reflection member 50 may contact one of the leads 12 and 22 of the lead frames 10 and 20 on which the LED chip 30 is mounted. That is, as shown in FIG. 1 and FIG. 4, in case that the LED chip 30 is mounted on the cathode lead frame 10, the extension portion 53 of the extension portions 53 and 54 of the heat radiation portion 52 of the metallic heat-radiation/light-reflection member 50, which is positioned near the cathode lead 12, may contact the cathode lead 12 as shown in FIG. 3. Accordingly, heat generated in the LED chip 30 can be transmitted to the metallic heat-radiation/light-reflection member 50 via the cathode lead frame 10 and thereby heat radiation surface facing outer air is increased to improve heat radiation efficiency.

At this time, as shown in FIG. 3, protrusion portions 46 which are interposed between the anode lead 22 and the extension portion 54 are formed at the indentation 45 of the bottom of the synthetic resin member 40 so as to prevent the anode lead 22 from contacting the extension portion 54.

Figure 5:
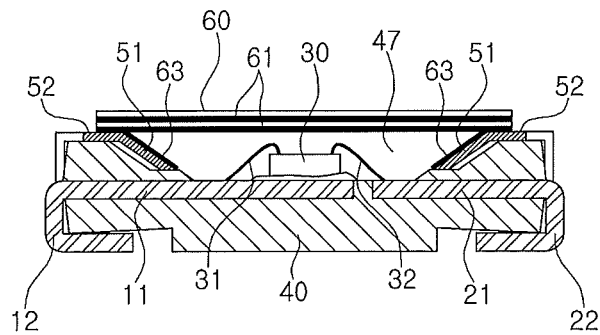
FIG. 5 is a cross sectional view of a light emitting diode device according to another embodiment of the present invention.
Figure 6:
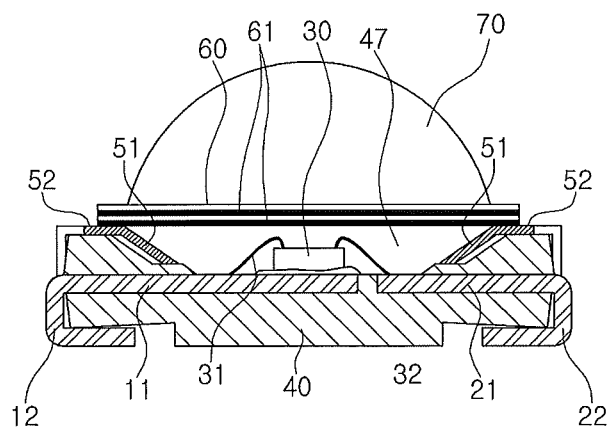
FIG. 6 is a cross section view of a light emitting diode device according to yet another embodiment of the present invention.

Hereinafter, a light emitting diode device according to another embodiment of the present invention will be explained with reference to FIG. 5 and FIG. 6. FIG. 5 is a cross sectional view of a light emitting diode device according to another embodiment of the present invention, and FIG. 6 is a cross section view of a light emitting diode device according to yet another embodiment of the present invention. The same reference numerals are used for the same parts of the above-stated embodiments, and explanations for the same will be omitted.

First, referring to FIG. 5, a reflection space 47 which is formed by the light reflection portion 51 of the metallic heat-radiation/light-reflection member 50 is emptied to form air layer instead of being filled with epoxy resin or silicon resin. A lens 60 which is disposed on an upper surface of the metallic heat-radiation/light-reflection member 50 to cover the reflection space 47.

The lens 60 may have a planar shape and may be formed of epoxy resin, silicon resin or the like.

The lens 60 includes a phosphor layer 61 to obtain light with a desired color. At this time, as shown in the drawing, the phosphor layer 61 may be provided with a plural.

In addition, phosphor may be coated on the surface of the light reflection portion 51 of the metallic heat-radiation/light-reflection member 50 to form a phosphor layer 63.

Meanwhile, referring to FIG. 6, the lens 60 may have a convex shape. That is, the lens 60 may include a convex portion 70 so as to have a convex shape. The convex portion 70 may also be made of epoxy resin, silicon resin, or the like.

According to the embodiments shown in FIG. 5 and FIG. 6, the LED chip 30 is disposed within an air layer rather than within epoxy resin or silicon resin, so thermal stress acting on the LED chip 30 can be minimized.

Another embodiment of the present invention will be explained hereinafter with reference to FIG. 7 to FIG. 13.

In this embodiment, a metallic heat-radiation/light-reflection member is not provided as a separate member but is realized by a cathode lead frame and an anode lead frame.

Referring to FIG. 7 to FIG. 11, a light emitting diode device according to an embodiment of the present invention includes the cathode lead frame 10 and the anode lead frame 20.

Figure 10:
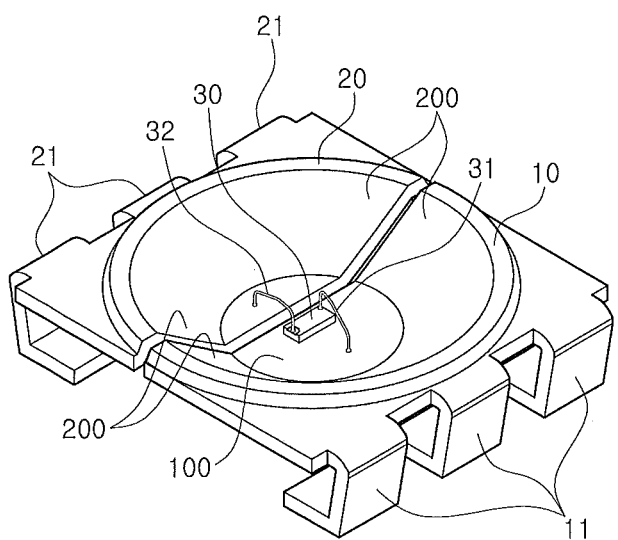
FIG. 10 is a perspective view of a cathode lead frame and an anode lead frame of a light emitting device according to an embodiment of the present invention.
Figure 11:
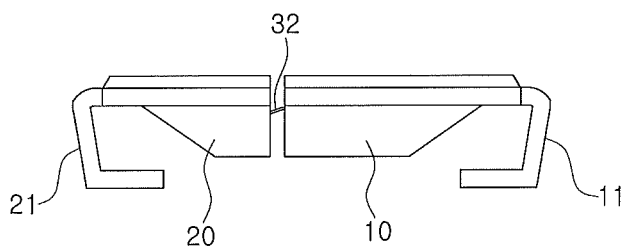
FIG. 11 is a side view of a cathode lead frame and an anode lead frame of a light emitting diode device according to an embodiment of the present invention.

The cathode lead frame 10 and the anode lead frame 20 act as terminals for applying electricity to a light emitting diode (LED) chip 30, and are disposed to be electrically insulated from each other. That is, as shown in FIG. 10 and FIG. 11, the cathode lead frame 10 and the anode lead frame 20 are disposed to be spaced from one another so as to be electrically insulated from each other.

The LED chip 30 is electrically connected to the cathode lead frame 10 and the anode lead frame 20 respectively. For example, the LED chip 30 may be fixed to an upper surface of the cathode lead frame 10 or the anode lead frame 20 by adhesive material, and may be electrically connected to the cathode lead frame 10 and the anode lead frame 20 via a pair of connecting wires 31 and 32 respectively. Although it is shown that the LED chip 30 is fixed to the cathode lead frame 10 in the drawing, the LED chip 30 may be fixed to the anode lead frame 20.

The synthetic resin member 40 plays a role of fixing the cathode lead frame 10 and the anode lead frame 20. The synthetic resin member 40 may be formed of nonconductive synthetic resin through an injection molding, and for example, may be made of synthetic resins such as Polyphthalamide (PPA) and liquid crystal polymer (LCP). As shown in the drawing, the synthetic resin member 40 may be formed to enclose the outer side and the lower side of the cathode lead frame 10 and the anode lead frame 20.

The cathode lead frame 10 includes the cathode lead 11 which is exposed from the synthetic resin member 40, and the anode lead frame 20 includes the anode lead 21 which is exposed from the synthetic resin member 40. Electricity can be applied via the cathode lead 11 and the anode lead 21.

As shown in the drawing, the cathode lead 11 and the anode lead 21 may be respectively extended to extrude from the synthetic resin member 40 and then may be downwardly extended to the bottom of the synthetic resin member 40.

The cathode lead frame 10 and the anode lead frame 20 may form a seat 100 to which the LED chip 30 is mounted, and a slanted reflection surface 200 which is upwardly and outwardly extended from the seat 100 to reflect light emitted from the LED chip 30. At this time, the upward direction means the upward direction in FIG. 8.

The seat 100 provides an area on which the LED chip 30 is mounted, and as shown in the drawing, may be provided on the cathode lead frame 10, and in other embodiment, the seat 100 may be provided on the anode lead frame 20. In addition, the seat 100 may be formed by the combination of the cathode lead frame 10 and the anode lead frame 20. At this time, as shown in the drawing, an upper surface of the seat 100 may be formed as a surface which is extended along a horizontal direction (horizontal direction in FIG. 8).

The slanted reflection surface 200 may be formed to be upwardly and horizontally extended from an outer end of the seat 100 to form a slanted surface. As shown in the drawing, the slanted reflection surface 200 forms an indentation which has a cup shape, a diameter of which becomes larger when it goes upward, and plays a role of reflecting light emitted from the LED chip 30. For example, the slanted reflection surface 200 may be formed by the combination of a slanted surface of the cathode lead frame 10 and a slanted surface of the anode lead frame 20.

As shown in the drawing, the slanted reflection surface 200 may have a circular sectional shape. That is, the horizontal sectional view of the slanted reflection surface 200 may have a circular shape. Meanwhile, according to other embodiments of the present invention, a sectional view of the slanted reflection surface may be a polygonal shape such as a rectangular shape or a hexagonal shape.

Further, the slanted reflection surface 200 may be formed as portions of the cathode lead frame 10 and the anode lead frame 20, so it is formed of metal having better heat conductivity than synthetic resins, so as to effectively radiate heat generated by the LED chip 30. That is, although a reflection surface of a conventional LED device is formed as a portion of a synthetic resin member, according to the present invention the cathode lead frame 10 and the anode lead frame 20 cooperatively form the slanted reflection surface 200, so improved light reflection and heat radiation characteristics can be simultaneously achieved through a simple structure.

Figure 8:
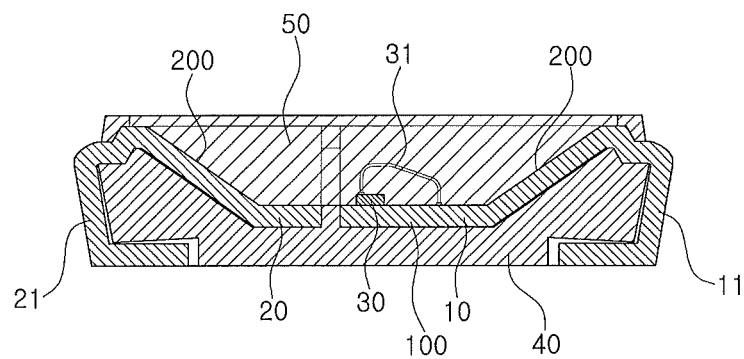
FIG. 8 is a cross sectional view taken along a line II-II in FIG. 7.
Figure 9:
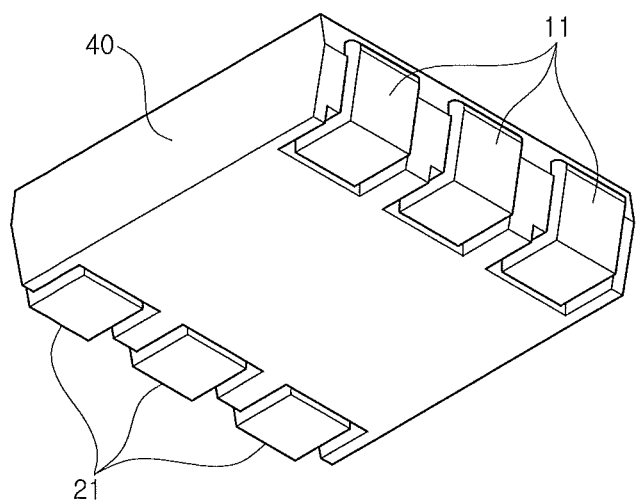
FIG. 9 is a bottom perspective view of a light emitting diode device according to an embodiment of the present invention.

Meanwhile, as shown in FIG. 8, the synthetic resin member 40 may be formed to enclose a lower surface of the seat 100 such that a lower surface of the seat 100 is not exposed to the outside.

Figure 7:
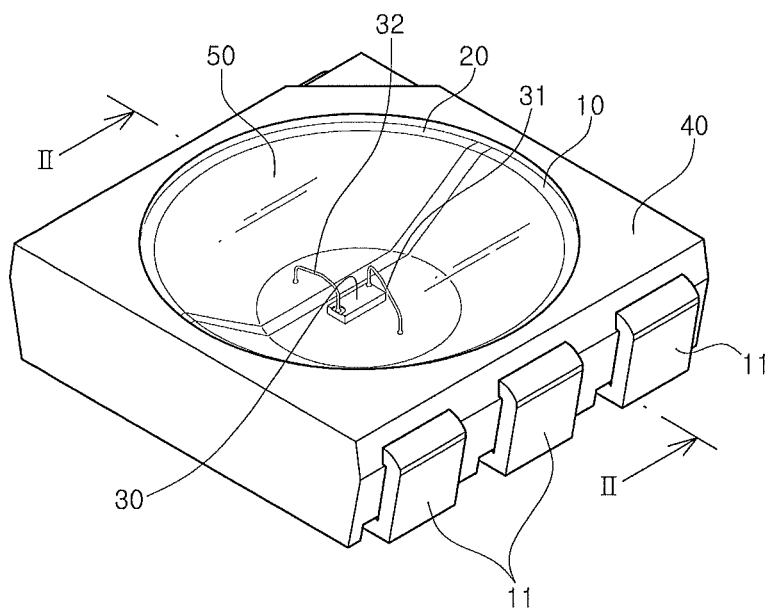
FIG. 7 is a perspective view of a light emitting diode device according to another embodiment of the present invention.

As shown in FIG. 7, the indentation which is formed by the slanted reflection surface 200 may be filled with an encapsulant 50 such as epoxy resin or silicon resin including phosphors. Accordingly, the LED chip 30 can be protected and at the same time light characteristics can be improved.

The phosphor can be suitably selected in accordance with a desired light type. For example, in case of a light emitting diode device emitting white light, the phosphor may be Y₃Al₅O₁₂:Ce phosphor, (Y,Gd)₃Al₅O₁₂:Ce phosphor, (Sr, Ba, Ca)₂_Si₁_M_O₄:Eu phosphor (here, M may be substituted with one of Y, Ce, La, Nd, Gd, Tb, Yb, and Lu, and may additionally include at least one element), (Sr, Ba, Ca)₂_Si₁_O₄:Eu phosphor, or (Sr, Ba, Ca)₂_Si₁_A_O₄:Eu phosphor (here, A may be substituted with one of F, Cl, Br, and S, and may additionally include at least one element).

Figure 12:
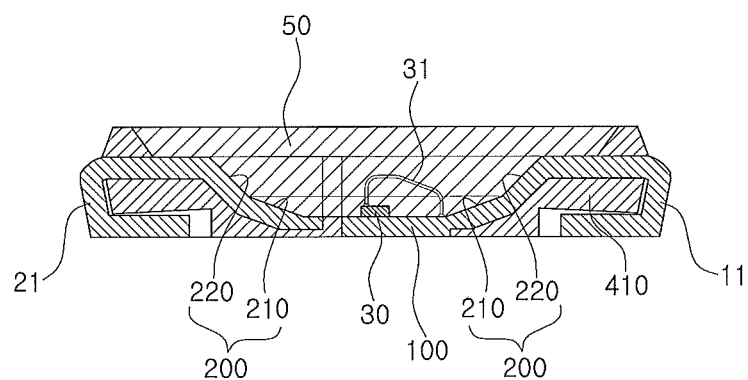
FIG. 12 is a cross sectional view of a light emitting diode device according to another embodiment of the present invention.

FIG. 12 is a cross sectional view of a light emitting diode device according to another embodiment of the present invention. Explanations for the same parts will be omitted.

Referring to FIG. 12, a synthetic resin member 410 may be formed to expose at least a portion of the seat 100 to the outside. Since the lower surface of the seat 100 is exposed to the outside, heat radiation characteristics can be enhanced.

The slanted reflection surface 200 may include slanted reflection surfaces 210 and 220 having different slanted angles. That is, as exemplarily shown in FIG. 12, two slanted reflection surfaces 210 and 220 are provided, and the slanted angle of the upper slanted reflection surface 220 may be greater than that of the lower slanted reflection surface 210. The number of the slanted reflection surfaces is not limited to two and may be varied. Since the slanted reflection surfaces 210 and 220 having different slanted angles are provided, light can be reflected to various direction and thereby light characteristics can be improved.

At this time, as shown in FIG. 12, upper surfaces of the cathode lead frame 10 and the anode lead frame 20 may be formed to be planar.

FIG. 12 is a cross sectional view of a light emitting diode device according to yet another embodiment of the present invention. Explanations for the same parts will be omitted.

Figure 13:
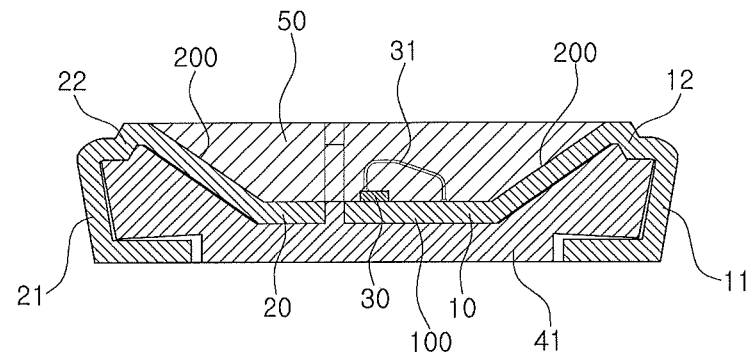
FIG. 13 is a cross section view of a light emitting diode device according to yet another embodiment of the present invention.

Referring to FIG. 13, the slanted reflection surface 200 is extended to an upper surface of a synthetic resin member 41, and the cathode lead frame 10 and the anode lead frame 20 may respectively include upset portions 12 and 22 which are formed to cover an upper surface of the synthetic resin member 41. That is, the upper surface of the synthetic resin member 41 is not exposed to the outside but is covered with the upset portions 12 and 22. Since the upper surface of the synthetic resin member 41 is not exposed to the outside, yellowing of the synthetic resin member 41 can be prevented.

Meanwhile, in another embodiment, the upset portions are omitted, and the upper surfaces of the cathode lead frame and the anode lead frame may be formed to be planar.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A light emitting diode device, comprising:
a cathode lead frame;
an anode lead frame which is electrically insulated from the cathode lead frame;
a light emitting diode chip which is electrically connected to the cathode lead frame and the anode lead frame respectively;
a synthetic resin member which forms an indentation receiving the light emitting diode chip and fixes the cathode lead frame and the anode lead frame; and
a metallic heat-radiation/light-reflection member which covers at least a portion of the indentation and covers an upper surface of the synthetic resin member, the metallic heat-radiation/light-reflection member being formed as a separate member from both the cathode lead frame and the anode lead frame, and being spaced from the cathode lead frame and the anode lead frame within said indentation, the metallic heat-radiation/light-reflection member including
a light-reflection portion which covers at least a portion of an inner surface of the indentation so as to form a reflection space where light emitted from the light emitting diode chip is reflected, and
a heat radiation portion which is extended from the light-reflection portion to cover the upper surface of the synthetic resin member, the heat radiation portion extending from the upper surface of the synthetic resin member and along a side of the synthetic resin member to a bottom of the synthetic resin member, the heat radiation portion being formed to contact one of the cathode lead frame and the anode lead frame.

2. The light emitting diode device of claim 1, wherein the light emitting diode chip is mounted to one of the cathode lead frame and the anode lead frame, and the heat radiation portion contacts the one of the cathode lead frame and the anode lead frame to which the light emitting diode chip is mounted.

3. The light emitting diode device of claim 1, wherein the cathode lead frame and the anode lead frame comprises respectively a cathode lead part and an anode lead part which are respectively extended to the bottom of the synthetic resin member, and the heat radiation portion contacts one of the cathode lead part and the anode lead part.

4. The light emitting diode device of claim 3, wherein the light emitting diode chip is mounted to one of the cathode lead frame and the anode lead frame, and the heat radiation portion contacts one of the cathode lead part and the anode lead part so as to contact the one of the cathode lead frame and the anode lead frame on which the light emitting diode chip is mounted.

5. The light emitting diode device of claim 1, wherein the light-reflection portion is formed to cover an upper portion of the inner surface of the indentation, and a lower portion of the inner surface of the indentation is formed as a reflection surface to reflect light emitted from the light emitting diode chip.

6. The light emitting diode device of claim 5, wherein the light-reflection portion is separated from upper surfaces of the cathode lead frame and the anode lead frame by the synthetic resin member.

7. The light emitting diode device of claim 1, wherein a surface of the light-reflection portion is coated with metal for improving a light reflectivity.

8. The light emitting diode device of claim 1, wherein the reflection space is emptied so as to form an air layer, and the light emitting diode device further comprises a lens, which is provided on an upper surface of the metallic heat-radiation/light-reflection member to cover the reflection space, provided with a phosphor layer.

9. The light emitting diode device of claim 8, wherein a surface of the metallic heat-radiation/light-reflection member is coated with phosphor.

10. The light emitting diode device of claim 1, wherein the heat radiation portion contacts the one of the cathode lead frame and the anode lead frame at a position outside of the indentation.

11. The light emitting diode device of claim 1, wherein the heat radiation portion contacts the one of the cathode lead frame and the anode lead frame at a position which is not between any two parts of the synthetic resin member on any straight line, further wherein the synthetic resin member extends along each of two opposite sides of the cathode lead frame, and along each of two opposite sides of the anode lead frame.

12. The light emitting diode device of claim 1, wherein the heat radiation portion is free of any contact with both the cathode lead frame and the anode lead frame within the indentation.

13. The light emitting diode device of claim 1, wherein the heat radiation portion extends along outer peripheral sides of the synthetic resin member.

* * * * *